United States Patent [19]

Chang et al.

[11] 4,040,018
[45] Aug. 2, 1977

[54] LADDER FOR INFORMATION PROCESSING

[75] Inventors: Hsu Chang, Yorktown Heights, N.Y.; Tien Chi Chen, San Jose; Chin Tung, Saratoga, both of Calif.

[73] Assignee: International Business Machines Corporation, Armonk, N.Y.

[21] Appl. No.: 556,378

[22] Filed: Mar. 7, 1975

[51] Int. Cl.² ........................................... G11C 11/14
[52] U.S. Cl. .............................................. 340/174 TF
[58] Field of Search ................................. 340/174 TF

[56] References Cited

U.S. PATENT DOCUMENTS

| | | | |
|---|---|---|---|
| 3,638,208 | 1/1972 | Chow | 340/174 TF |
| 3,770,978 | 11/1973 | Kluge | 340/174 TF |
| 3,916,397 | 10/1975 | Takahashi | 340/174 TF |

OTHER PUBLICATIONS

IBM Technical Disclosure Bulletin, - vol. 17, No. 12, May 1975, pp. 3729-3731.

*Primary Examiner*—James W. Moffitt
*Attorney, Agent, or Firm*—Jackson E. Stanland

[57] ABSTRACT

Information processing is conveniently achieved by a structure which uses a novel binary switch. The switch can steer two data streams so that they will either cross one another or bypass one another, depending upon external control. A linear array of shift register loops are linked together by these flow-steering binary switches to form a storage structure which is termed a ladder. The ladder provides a variety of data structures. For example, it can alternate between LIFO (last in-first out) and FIFO (first in-first out). It can also dynamically rearrange data items according to recency of usage, in order to improve average access time to any data item. The binary switch and the ladder structure are conveniently provided using magnetic bubble domain technology, although other technologies can also be used.

23 Claims, 25 Drawing Figures

CROSS-OVER

BYPASS

CROSS-OVER

BYPASS

GLOBAL SHIFT

DETACHED SHIFT

EXCHANGE

DELTA EXCHANGE

LADDER FOR INFORMATION PROCESSING

BACKGROUND OF THE INVENTION

1. Field of the Invention

This invention relates to novel binary switches which can cause data streams to cross one another or bypass one another, and to storage/data manipulation systems utilizing these switches to link shift registers.

2. Description of the Prior Art (see end of specification, also)

Various magnetic bubble domain systems are known in the art which combine data manipulation operations and storage on the same magnetic chip. Examples of such systems are shown in U.S. Pat. No. 3,701,125 which illustrates a magnetic bubble domain chip including memory and decoder functions, and U.S. Pat. No. 3,689,902, which describes a bubble domain decoder and storage system having means for clearing information from any or all storage cells.

In addition to the examples listed above, several patents show data rearrangement schemes implemented in magnetic bubble domain technology. In particular, dynamically ordered storage registers are shown which operate on a "most recently used algorithm". In such an apparatus, data is arranged where ease of access is in accordance with its last use. That is, data is stored in the shift register in order of last use so that the last bit of information which has been accessed is in the first, or the access, position of the register. Therefore, it can be read out of the storage without shifting. The next to the last bit of information accessed is stored in the adjacent position so that it can be accessed by shifting the contents of the register only one position. If data is stored in this manner, any desired data item can be reached with considerably less shifting operations on the average than would be necessary if the data had been stored randomly in the shift register. An example of such dynamically reordered storage apparatus implemented in magnetic bubble domain technology is shown in U.S. Pat. No. 3,670,313. Additionally, U.S. Pat. No. 3,797,002 describes a dynamically double ordered shift register memory utilizing a plurality of bidirectional shift registers. Access to data for rearrangement can occur at either end of the shift registers.

Still another dynamically ordered shift register is described in U.S. Pat. No. 3,766,534. In this patent, multi-dimensional dynamic ordering is achieved and multiple bits can be sorted in memory using multiple access positions. This reduces the average access time to data items and also substantially reduces worst case access time for all data items. Still other examples of bubble domain data rearrangement systems are shown in U.S. Pat. No. 3,737,881 and 3,701,132.

In the data rearrangement devices described in the listed patents, the magnetic drive field used for moving bubble domains has to be either stopped or reversed in order to provide the bubble domain rearrangement operations. This is a distinct disadvantage since more complicated control circuits are required and more power is used for controlling the magnetic drive field. Additionally, the execution of the various other bubble manipulation functions becomes more difficult since the operation of all bubble devices in the same module is synchronized.

In the present invention, a steady, rotating magnetic drive field is provided in the plane of the magnetic film which supports the bubble domains. All operations are performed without the requirement of stopping or reversing this in-plane drive field. This drive field can be provided by using two sinusoidal magnetic fields which are 90° out of phase with each other, or by using pulse fields ($\pm i$, $\pm y$), as is well known in the art. If charge coupled device technology is used, the same repetitive sequence of drive pulses is continually used, there being no need to change the drive pulse sequence in any way, or to stop it. Additionally, no gap is created in the data stream as a result of the operations which are performed. The present structure has considerable flexibility and can be applied to all types of data manipulation/storage arrangements.

In addition to the advantage mentioned with respect to the use of a steady, rotating magnetic drive field, the present invention seeks to use intersecting data streams to perform storage/data manipulation operations such as sorting, dynamically ordered storage, etc. All of the patents mentioned previously do not utilize intersecting data streams in which each data stream continually moves during each full cycle of the drive field (or drive pulses) to perform their various operations. However, bubble domain systems for performance of text editing functions using a constant, rotating magnetic drive field are described in copending applications Ser. No. 469,927 now U.S. Pat. No. 3,967,263 and Ser. No. 469,926 now U.S. Pat. No. 3,950,732, filed May 14, 1974. However, the text editing systems described therein do not utilize structure wherein data streams intersect one another or bypass one another continually during the drive field cycle. In the present apparatus, the use of a binary switch instead of freeze/bypass of data bits, results in reordering of data by blocks rather than by bits, as is done in the prior art.

Accordingly, it is a primary object of the present invention to provide novel switch arrangements which can cause data streams to either cross or bypass each other depending upon control signals.

It is another object of the present invention to utilize such novel switches to provide structure that is capable of many data storage/manipulation functions.

It is another object of the present invention to provide a bubble domain apparatus which can alternate between several data structures.

It is a further object of the present invention to provide apparatus for manipulating data streams without altering the original bit pattern after the operations are performed. Thus, it is an object to provide data manipulation in which there will be no loss of original data, no addition of spurious data, and no unwanted internal permutation of the original bit pattern.

It is a still further object of the present invention to provide a bubble domain storage/data handling apparatus which has significant flexibility for application in any type of data/storage management system.

It is another object of the present invention to provide an improved data storage/manipulation structure which can be implemented in several technologies.

It is still another object of the present invention to provide a shift register storage system using binary flow-steering switches for provision of flexible and versatile systems which can be used in any type of data handling apparatus.

It is another object of the present invention to provide a magnetic bubble domain storage/data manipulation apparatus which can provide several data handling operations using a constant repetitive pattern of drive pulses, where the pattern does not have to be altered or stopped in any manner in order to achieve any or all of these data operations.

BRIEF SUMMARY OF THE INVENTION

This invention describes a new binary flow-steering switch which can allow two data streams to cross one another or bypass one another depending upon the control applied to the switch. This switch can be implemented in several technologies, including bubble domain technology and charge coupled device technology.

A new type of information storage apparatus is provided by linking several shift register structures with these binary switches. This can be used to form a "ladder" type structure which can alternate between two types of data structures. In the former, a last in — first out data arrangement is provided while in the latter a first in — first out data structure is provided. Using this type of ladder structure, data items can be easily rearranged in accordance with recency of usage in order to improve both the average access time and the access time to any data item. In contrast with prior art systems which perform these operations, the present structure can use a fixed repetitive sequence of drive pulses which need not be altered in any way during performance of all data operations.

In a particular embodiment, a plurality of shift registers are linked with binary switches that can be controllably set to cross data streams or bypass data streams. Thus, each shift register can be made to idle independently of the other shift registers or the individual shift registers can be connected to provide a large "twisted shift register". An I/O station is provided for writing new information into storage, reading information in storage, or clearing information from storage. Control circuitry is provided to change all binary switches at the same time, or to individually control binary switches. Thus, any number of individual shift registers can be made to independently idle while other registers are connected together.

These and other objects, features, and advantages will be more apparent from the following more particular description of the preferred embodiments.

DETAILED DESCRIPTION OF THE PREFERRED EMBODIMENTS

Figure 1A:
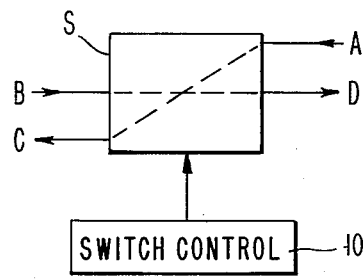
FIGS. 1A and 1B illustrate the basic binary switch used in the present invention, FIG. 1A indicating the data stream cross-over operation while FIG. 1B indicates the data stream bypass operation.
Figure 1B:
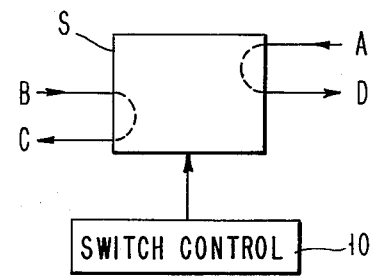
Figure 2:
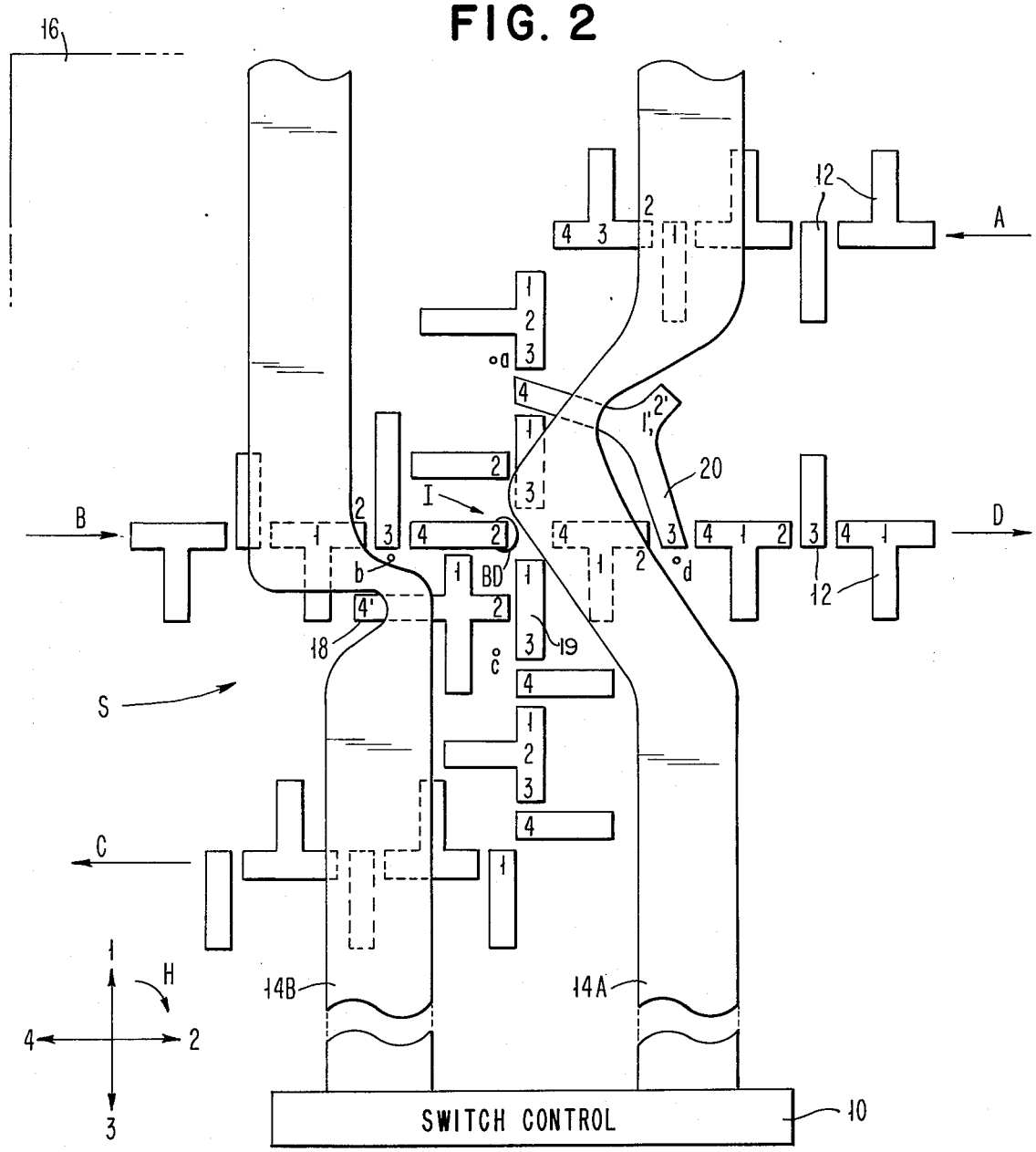
FIG. 2 is a detailed drawing of a binary switch implemented in magnetic bubble domain technology.

Binary Switch (FIGS. 1A, 1B, 2)

The binary switch will steer two data streams so that the streams will either cross one another or bypass one another, depending upon how the switch is controlled. FIGS. 1A and 1B illustrate the crossover and bypass modes of operation of the switch S, respectively. Thus, a two-input (A,B)/two-output(C,D) binary switch is provided for the simultaneous steering of two data streams in two distinct modes.

In the following explanation, it will be assumed that the switch and later described structures will be fabricated from magnetic bubble domain devices and that the data streams are bubble domain streams. However, as will be illustrated later, other technologies (such as semiconductor charge coupled devices) can be used to implement these structures.

FIG. 1A illustrates the crossover mode of operation of the binary switch S. In this mode, the input data A (having any type of coding) crosses over input data stream B and exits along the path C. Correspondingly, the other input data stream B crosses the data path of A and exits along the direction D. Operation in this mode is under control of switch control 10.

In FIG. 1B, the bypass mode of operation of switch S is illustrated. In this mode, input data stream A enters switch S and exits along path D, while input stream B enters switch S and exits via path C. Thus, the data streams A and B bypass one another in contrast to the operation illustrated in FIG. 1A where they cross one another. Again, switch control 10 determines the mode of operation of switch S.

FIG. 2 illustrates a bubble domain embodiment of the binary switch S. In this embodiment, switching between operational modes is under control of currents in conductors. However, alternate types of control, such as that afforded by planted control bubble domains, can be utilized. For instance, switch operation similar to that shown in copending applications Ser. No. 429,415 filed Dec. 28, 1973 now abandoned, and Ser. No. 429,411 filed Dec. 28, 1973 now abandoned can be used.

FIG. 2 shows a binary switch S which enables two bubble streams moving under a steady drive field H to cross each other at different phases of the same drive field cycle using an idler type device. These bubble streams cross one another without destructive interference. The switch itself is comprised of magnetic elements such as the T and I bars 12. As such, the switch is essentially the same as that shown in U.S. Pat. No. 3,543,255, except that control means is provided for changing the mode of operation of the switch. Thus, rather than having the data streams A and B cross over each other at all times, the operation of switch S can be controlled so that the data streams A and B can be made to bypass one another.

In FIG. 2, conductors 14A and 14B, connected to switch control 10, are used to place the switch in the bypass mode of operation. That is, when currents are present in these conductors, input stream A will enter switch S and leave via path D, while input stream B will enter switch S and leave via path C. Conductors 14A and 14B have portions of reduced width where and only where intensified magnetic field gradients are produced for diverting the bubble streams A and B (in the magnetic medium 16) in order to achieve the bypass operation.

When no currents are present in conductors 14A and 14B, the bubble streams A and B cross over one another. The crossover operation depends upon the action of the bubble domain idler I located in the center of switch S. The bubble domain BD in the idler will be ejected out of the idler by a bubble in the input data stream, which data bubble will then stay in the idler and be the new idler bubble to be ejected when the next data bubble enters. Thus, the idler bubble is always replenished from the input data bubbles and the idler bubble is always ejected from the idler each time a data bubble enters the idler. The input bubble streams cross one another at different phases of the drive field H cycle and therefore no destructive interference of data streams occurs. Each data stream continually moves during all phases of H, in contrast to holding techniques where data bits are held substantially in place during different phases of H.

In more detail, the binary switch S is comprised of magnetic elements 12 located adjacent to a magnetic medium 16 in which the bubble domains exist. Magnetic elements 12 provide propagation paths for the bubble domain streams A and B. The intersection point of the bubble domain streams A and B is comprised of an idler I. A bubble domain BD resides in the idler and continuously circulates in the idler in response to the different orientations of the field H. Conductors 14A and 14B can be located either over the magnetic elements 12 or under them.

To explain the bypass operation, it is assumed that the field H rotates in a clockwise direction as shown. At field phase 3, the leading bit position of input stream A is labeled $a$, the leading bit position of stream B is labeled $b$, the trailing bit position on path C is labeled $c$, and the trailing bit position in path D is labeled $d$. When control conductors 14A and 14B are not activated, switch S operates in the crossover mode. In this mode, the bit at position $a$ will be connected to the bit at position $c$ while the bit at $b$ will be connected to the bit at $d$. During activation of the control conductors, the crossover idler I is bypassed. If the bypass action is started at field phase 3, a current through conductor 14B during field phases 4 and 1 will cause transfer of a bubble domain at bit position $b$ to pole position 4' on magnetic element 18. The bubble will remain there until field phase 2, after which it will move to pole position 3 on bar 19 when H is in phase 3. Thus, the domain at position $b$ will move to position $c$ during the bypass operation. Correspondingly, a current in conductor 14A during field phase 1 will steer a bubble domain at bit position $a$ along element 20 to pole positions 1' and 2' and then to pole position 3 on modified $y$ bar 20. Thus, the domain will be at bit position $d$.

When the switch is converted from the crossover mode to the bypass mode, no excess bubble domain is left behind in the idler area except the idler bubble itself. Additionally, no gap is created when converting from the bypass mode back to the crossover mode.

LADDER STRUCTURE (FIG. 3)

Figure 3:
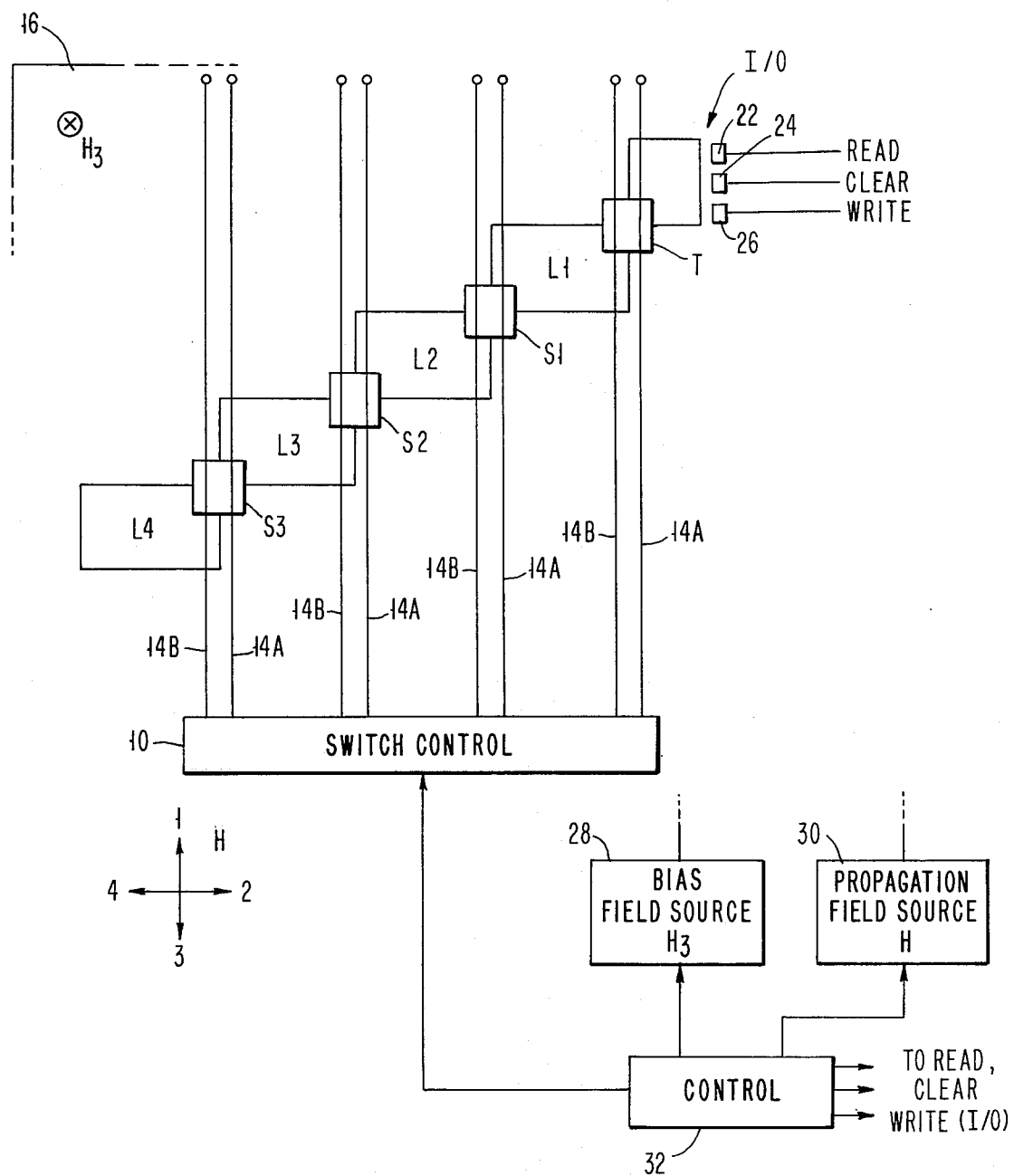
FIG. 3 is an illustration of a ladder storage structure comprising a plurality of shift registers linked by binary switches, together witn an I/O unit for provision of read, write, and clear operations.

A sequence of data storage loops can be linked in a ladder-like manner, to obtain the ladder structure shown in FIG. 3. The intersections of adjacent storage loops include a binary switch of the type previously described. As will be explained in more detail, the provision of the binary switches at the intersections of the various loops enables data in the loops to idle around each separate loop or to be interconnected in a sequential fashion.

Referring more particularly now to FIG. 3, a plurality of shift register loops L1, L2, L3 and L4 are interconnected by the binary switches S1, S2, and S3. Additionally, loop L1 is interconnected with a loop designated as an I/O loop. Switch T is the same as switches S1-S3. It is given a different designation only to facilitate later discussion of the operation of the ladder structure. Associated with the I/O loop are a read circuit 22, a clear circuit 24, and a write circuit 26.

The individual binary switches T and S1-S3 have their modes of operation determined by currents along the associated conductors 14A and 14B. Currents in these conductors are under control of switch control unit 10 which can operate all binary switches at the same time or independently of one another. For instance, switches S1-S3 can be operated simultaneously while switch T can be separately operated.

For a ladder structure using magnetic bubble domain technology, a bias field source 28 provides a magnetic bias field $H_z$ for stabilizing the size of the domains in magnetic medium 16. A propagation field source 30 provides a rotating magnetic field H in the plane of the magnetic medium for movement of the domains.

A control circuit 32 provides timing and control signals to switch control unit 10, bias field source 28, propagation field source 30, and to the read 22, clear 24, and write 26 circuits associated with the I/O loop.

For an embodiment using magnetic bubble domain technology, reference is made to FIG. 2 which shows a typical binary switch S which can be used to interconnect two storage loops. For example, data stream A can be flowing in one storage loop while data stream B can be flowing in an adjacent storage loop. If the switch S is in its bypass mode, then data stream A will continue to circulate around its storage loop, following the path indicated by arrow D. Correspondingly, data stream B will continue to flow around its storage loop following the path indicated by arrow C. If switch S is in the crossover mode, then data streams A and B will cross the switch and move into the adjacent storage loops.

Read, clear and write circuitry is well known in magnetic bubble domain technology, and reference is made to U.S. Pat. No. 3,689,902. In that reference, a current loop clear means is shown for removing information from a shift register loop, while various controlled domain generators are also shown. Sensing is provided by conventional magnetic bubble domain sensors, such as magnetoresistive sensing devices.

The bias field source 28 and the propagation field source 30 are also well known in the bubble domain technology. For example, a bias field $H_Z$ can be readily provided by a current carrying coil, a permanent magnet, or by an exchange coupled layer located on the magnetic film 16. The propagation field source 30 is conveniently provided by a plurality of current carrying coils located around magnetic medium 16.

The switch control unit 10 and overall control unit 32 are also conventionally known electronic circuitry which provides timing pulses for operating the various components of the storage apparatus. Switch control 10 provides current pulses of the required magnitude and duration in conductors 14A and 14B for controlling switch operation.

In the ladder structure of FIG. 3, the various loops L1, L2, L3, and L4 are assumed to have equal lengths while the I/O loop has a length one-half that of the loops L1–L4. Additionally, it is assumed that two data items completely fill each of the loops L1–L4. While this is a convenient basis for describing the operation of the ladder structure, such requirements concerning the length of the loops L1–L4 and the I/O loop, as well as the length of the data items in these loops, are not necessary to the successful operation of a ladder type structure. Further, data storage and manipulation can occur throughout the ladder, as will be apparent. The basic ladder structure is capable of various data manipulation functions, since the binary switches can be used to either interconnect or separate the loops in the ladder. Additionally, any number of loops can be sequentially connected or disconnected from one another. Therefore, data in the various loops can be interchanged to provide numerous sorting functions, as will be more fully explained with respect to the rest of the drawing.

LADDER OPERATIONS (FIGS. 4A, 4B, 5, and 6A–6D)

Figure 4A:
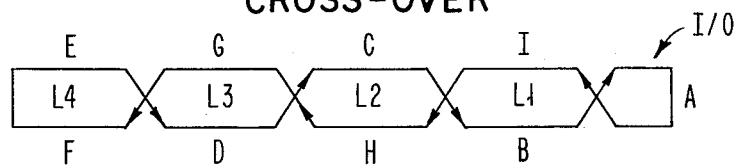
FIGS. 4A and 4B illustrate the data flow of a ladder structure when all binary switches are in their crossover mode.
Figure 4B:
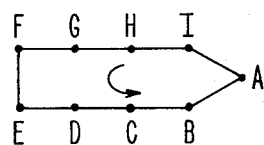

These figures illustrate some of the data manipulation operations which can be performed with a ladder structure in order to provide improved data handling organizations. For instance, FIG. 4A illustrates the data flow for nine data items A, B, C, D, E, F, G, H, I when all binary switches S1–S3 and T are in the crossover mode. If all switches are set in the crossover mode, then the whole ladder structure behaves as a large "twisted loop". The sequential flow of the data in such a loop is illustrated more clearly in FIG. 4B, where data item A is in the I/O loop.

Figure 5:
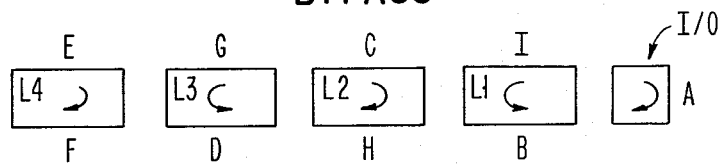
FIG. 5 illustrates the data flow of information in a ladder structure when all binary switches are in their bypass mode of operation. In this mode, each shift register merely "idles".

FIG. 5 illustrates the data flow when all binary switches S1–S3 and T are in the bypass mode. In this mode, a collection of independent loops results and information flow in each loop L1–L4, as well as in the I/O loop, is indicated by the arrows within each of these loops. This is defined as the idle state of the ladder.

The various binary switches interconnecting the loops can also be individually set, if needed, to produce arbitrarily localized looping of information. For instance, switch S3 can be set in the crossover mode to link loops L3 and L4, while the remaining binary switches are in the bypass mode. This means that information in loops L1 and L2, as well as the information in the I/O loop, merely recirculates around each of these loops. This type of flexibility is not readily available in other technologies and has significant implications in system applications, such as data/storage management. Two applications will be now described which demonstrate the flexibility and versatility of the ladder structure.

LIFO and FIFO Structures

In the ladder structure of FIG. 3, it is assumed that each loop L1–L4 contains two data items (e.g., two pages or two records). For instance, loop L1 can contain storage records B and I as shown more clearly in FIG. 4A. It is also assumed that the I/O loop is attached to the right-most loop (L1) and that the time it takes a data item to travel half the perimeter of any loop L1–L4 is defined as a cycle.

When all binary switches are operated in the bypass mode, the data items in the ladder merely circulate around independent loops L1–L4, and also circulate around the I/O loop. In this mode, the content of the ladder alternates between forward and reverse sequences. For example, the present sequence ABCDEFGHI will be changed to IHGFEDCBA one cycle later, and will be changed back to its original order after another cycle. This data sequence reversal is achieved without reversing the in-plane drive field H. If a semiconductor charge coupled device technology is utilized, the same repetitive sequence of drive pulses is used to provide the data sequence reversal. The sequence of data items can therefore be accessed, with a single I/O loop, from either the "head" or the "tail" end of the data.

If ABCDEFGHI is the input order into the ladder structure, then after idling for an even number of cycles, A would be available for immediate read-out followed by B, C, D, ..., etc. if all switches are set for crossover. On the other hand, after an odd number of idle cycles, data item I — written into the ladder last — would be available for read-out first, followed by data items H, G, F, ... etc. Consequently, the data items in the ladder can alternate from cycle to cycle between the LIFO structure (last in — first out) and the FIFO (first in — first out) structure.

FOUR BASIC OPERATIONS

Figure 6A:
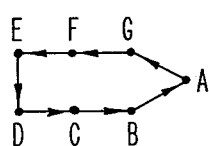
FIGS. 6A, 6B, 6C, and 6D show four typical data manipulation operations which can be performed using the ladder structure of FIG. 3. These four operations in combination already enable the ladder structure to perform complicated data rearrangements, such as dynamically ordered storage.
Figure 6B:
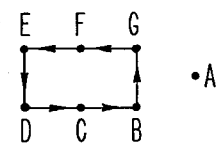
Figure 6C:
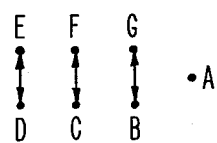
Figure 6D:
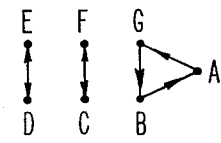

Four basic operations sufficient to perform many important ladder functions are used. These are shown in FIGS. 6A–6D and are the following:

| | |
|---|---|
| FIG. 6A - global shift: | T = CROSSOVER, S = CROSSOVER. |
| FIG. 6B - detached shift: | T = BYPASS, S = CROSSOVER. |
| FIG. 6C - exchange: | T = BYPASS, S = BYPASS. |
| FIG. 6D - delta exchange: | T = CROSSOVER, S = BYPASS. |

Exchange and global shifts are used in realizing LIFO–FIFO structures; other operations are used for optimal dynamic data arrangement.

DYNAMIC DATA REARRANGEMENT

Often there is locality in storage references; that is, the more recently referenced items tend to have higher probabilities to be referenced in the immediate future than other items. Storage systems can be organized to exploit this phenomenon in order to reduce the average access time. In so doing, the more recently referenced items are placed closer to the I/O loop. This is done by starting with a linearly-ordered arrangement of data items, assuming that the highest ranked (closest to the I/O loop) has the highest probability to be accessed next. Subsequent accesses modify the order according to the recency of usage. The dynamic data rearrangement is done in two steps:

1. fetching: move the requested item to the I/O position, and
2. resetting: push all intervening items (between the old and new highest ranking items) down by one position (from their original positions). For example, after accessing item C in the sequence ABCDEFGHI, the ordering would be CABDEFGHI.

This principle of dynamic reordering has been mentioned previously with respect to the patents discussed as prior art references. However, it will be readily apparent that the present technique performs rearrangement of data to achieve dynamic reordering without requiring changes in the repetitive sequence of drive pulses used to move the data and without requiring stoppage of these drive pulses. In the particular case of bubble domain technology using in-plane magnetic fields for movement of bubbles, a steady rotating magnetic field can be used for all data manipulations.

Linear ordering of data items in the storage involves the concept of distance of a given item. This "distance" is defined to be the number of items separating the given item from the I/O port (loop). For example, the topmost item in a sequence of data items has a distance of zero, while the second item has a distance of one, etc.

In the ladder structure shown in FIG. 3, the I/O loop is half the size of the individual loops L1-L4 and contains only the data item ready for read-write operations. It takes $d$ cycles to move a data item at a distance $d$ to the I/O loop, with all switches of the ladder set for crossover operation. A nine item, ABCDEFGHI, ladder with item A in the I/O loop is shown in FIG. 4A. The distances of data items A, B, C, D, E, F, G, H, and I are 0, 1, 2, 3, 4, 5, 6, 7, and 8 respectively.

In order to minimize control complexity, switches S1-S3 are identically controlled while switch T is separately controlled. To perform dynamic data rearrangement, the various operations shown in FIGS. 6A-6D are utilized. Depending upon whether the distance of the requested data was known a priori, the strategies of moving data on the ladder for dynamic rearrangement are different. An example will be presented for an n-item ladder, where $n=2m+1$. Here, there are $m$ loops each of which contains 2 data items and one I/O loop which contains one data item. Starting at full cycle time boundary for such an n-item ladder ($m$ is a positive integer), the procedure is:

---

Case 1: Distance d known a priori

(i) for $d=0$,   do nothing
(ii) for $1 \leq d \leq m$:
  Fetching:   apply global shift (d-1) times and then delta-exchange once.
  Resetting:   apply detached-shift (d-1) times and then exchange once.
    Total time = (d-1) + 1 + (d-1) + 1 = 2d cycles.
(iii) for $m+1 \leq d \leq n-2$:
  Fetching:   apply exchange once, global shift (n-d-1) times, and then delta-exchange once.
  Resetting:   apply detached-shift (n-d-2) times.
    Total time = (n-d+1) + (n-d-2) = 2(n-d)-1 cycles
(iv) for $d=n-1$:
  Fetching:   apply exchange once, and then global shift once.
  Resetting:   apply exchange once.
    Total time = 2+1 = 3 cycles.

Case 2: Distance d unknown a priori

Fetching:   apply global shift until the requested item is in the I/O position and then its original distance, d, is known.
  Resetting:   (i) for $1 \leq d \leq m-1$, apply exchange once, detached shift d times, and then exchange once.
    (ii) for $m \leq d \leq n-1$, apply detached shift (n-1-d) times.
    Total time = d + min{(d+2),(n-1-d)} = min{(2d+2),(n-1)} cycles.

---

In each case, the desired sequence of data items, after resetting, is automatically maintained by repeatedly executing the idle operation (all switches in bypass mode) without any alteration of the in-plane magnetic drive field, until further operations need to be performed.

Operation in this manner has been proved to be optimal. It is to be contrasted with prior dynamically ordered storage operations where only a global shift and a detached shift (FIGS. 6A and 6B, respectively) are possible, where the detached shift requires a reversal of the magnetic drive field H or a reversal of the application of the drive pulses if technologies such as semiconductors are used. Thus, the present structure allows more variations of data handling operations and therefore does not need any type of removal or reversal of the drive field.

EXAMPLES (FIGS. 7A-7G and 8A-8G)

FIGS. 7A-7G and FIGS. 8A-8G illustrate dynamically ordered rearrangement of data in an 11-item, 6-loop (including I/O) bubble domain ladder.

A. $1 \leq d \leq 5$ It is desired to access record E ($d=4$).

Figure 7A:
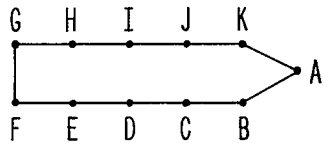
FIGS. 7A-7G and 8A-8G illustrate the operation of the ladder structure of FIG. 3 for the performance of a data rearrangement function.
Figure 7B:
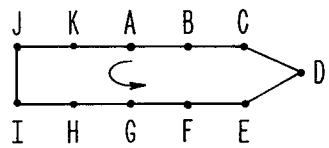

1. The 11-data item ladder is shown in FIG. 7A. A global shift of 3 cycles is then undertaken in the direction of the arrow to obtain the data configuration shown in FIG. 7B.

Figure 7C:
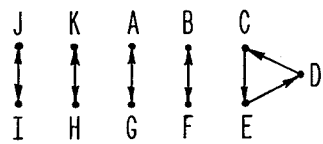

2. A delta-exchange is then performed for one local cycle among the I/O loop and loop L1. This involves data items D, C, and E. The other storage loops undergo data exchange. This is illustrated in FIG. 7C. The operations of steps (1) and (2) provide the fetching operation.

Figure 7D:
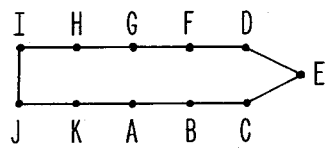
Figure 7E:
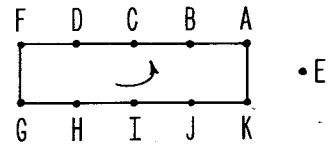

3. After the binary switches are reset in the crossover mode, the data arrangement of FIG. 7D is obtained. At this time, a detached shift is performed for 3 cycles to obtain the arrangement of FIG. 7E.

Figure 7F:
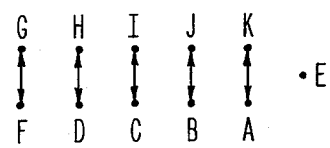
Figure 7G:
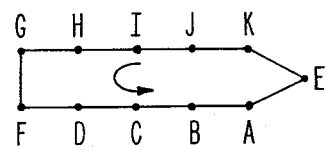

4. Data exchange is performed for all storage loops with the exception of the I/O loop as indicated in FIG. 7F. When all binary switches have been returned to the crossover mode, the data arrangement of FIG. 7G is obtained. This completes the resetting operation and it is apparent that record E is in the I/O port while other data items are arranged in the proper order.

In general, the total time for the bubble ladder $t_{BL}$, is given by $$t_{BL} = 2d \text{ for } 1 \leq d \leq N-1$$

where there are N loops (N−1 storage loops plus one I/O loop) for a total of 2N−1 data items.

Figure 8A:
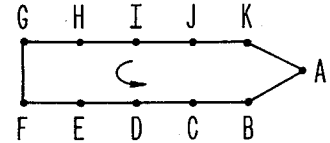

B. $6 \leq d \leq 10$ Data items H ($d=7$) is to be accessed. FIG. 8A shows the initial data arrangement in the ladder when all binary switches are in the crossover mode.

Figure 8B:
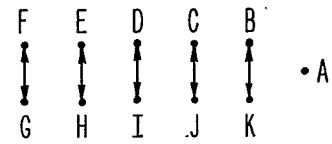
Figure 8C:
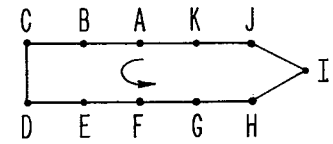

1. Data exchange occurs for all data items except item A, which is in the I/O loop. This operation is shown in FIG. 8B.

2. After data exchange, all binary switches are set in the crossover mode and a global shift is performed for 3 cycles. This provides the data arrangement shown in FIG. 8C in which data item I is in the I/O loop.

Figure 8D:
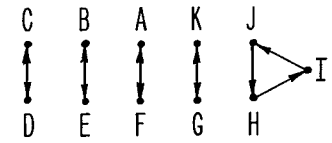
Figure 8E:
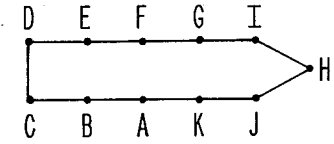
Figure 8F:
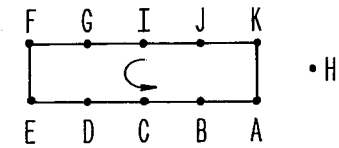
Figure 8G:
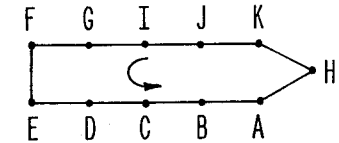

3. A delta exchange is then performed between storage loop L1 and the I/O loop, while data exchange occurs in all other storage loops. This is illustrated by FIG. 8D. After these exchanges, the binary switches are put in the crossover mode to yield the data arrangement of FIG. 8E.

4. A detached shift is then performed with data item H left in the I/O loop. This detached shift is for two cycles and produces the data arrangement shown in FIG. 8F. The desired stack configuration is then obtained. After this, binary switch T is set in the crossover mode and the data arrangement of FIG. 8G results, which is the desired stacking arrangement. That is, item H is in the I/O loop and all other data is in the proper order.

The total number of cycles required to access item H and perform resetting is 7. These steps can be applied to every data item in the second half of the data stack except the last record (item K with $d=10$), which requires three cycles.

Text Editing Applications

As described in aforementioned copending applications Ser. No. 469,927 and Ser. No. 469,926, text editing requires functions such as deletion of records, insertion of new records, and gap closing whenever records have been modified. These operations can be performed using the ladder structure as described herein.

The I/O loop has write, read and clear capability as described previously. While shifting on a global loop a given data item (record) can be retained at the I/O loop by switching the global loop into, for instance, the sub-global loop (i.e., a detached shift). Thus, the desired record can be retained in the I/O loop while other data recirculates. This process is an extraction process for removing a record from a group of records. Thus, the deletion operation of text editing can be achieved.

The data item at the I/O stage can join the sequence of other data items in the bubble ladder structure at the desired position by switching the bubble ladder to a global loop (global shift). Consequently, the new information or previously obtained information can be inserted into the sequence of data records at any place. Again, this is a function which is necessary for text editing.

By continually repeating extraction and insertion, any two records in a stream of data records can be exchanged. This means that the bubble ladder is capable of providing the functions of read, write, deletion, insertion and data exchange. Further, as was mentioned previously, no alteration of the original bit patterns whatever occurs when the binary switches are converted between their bypass mode and crossover mode of operation. Therefore, no gap should be obtained in the overall data stream even if different length records are inserted during the various operations.

Alternatives

The basic binary switch can be implemented in many ways in addition to that shown in FIG. 2 for the bubble domain technology. For instance, instead of external conductor control of the mode of operation of the switch, a bubble domain loadable switch of the type shown in aforementioned Ser. No. 429,411 can be used. Additionally, while T and I bars are shown for movement of data bubbles, any type of bubble propagation scheme can be utilized. The type of data coding used is incidental to the operation of the switch and the ladder.

The binary switch of FIG. 2 utilizes an idler circuit as a major component thereof. However, the prior art describes other types of bubble domain crossover circuits which do not use idler circuitry. An example of such a data crossover circuit is shown in U.S. Pat. No. 3,676,843.

Additionally, the movement of bubble domains in a magnetic medium is not unlike the movement of charge in a semiconductor media. Therefore, the propagation circuitry and switch circuitry can be implemented using semiconductor charge coupled devices. In such circuitry, charge is moved by voltage pulses appearing on conductor lines, where repetitive phases of voltage pulses are used to continually move the charge. The following paragraphs will discuss the design of ladder-type structures using charge-coupled devices.

The basic building blocks for ladder structures are the two-input/two-output switches. One type (FIG. 2) is the crossover switch which is based on an idler for data streams crossing each other and control conductors to enable data streams to bypass each other. The quiescent data paths are A to C and B to D, and the conductor-activated data paths are A to D and B to C.

A second type of switch arrangement utilizes two "single-pole double-throw" switches (1 and 2) as shown here.

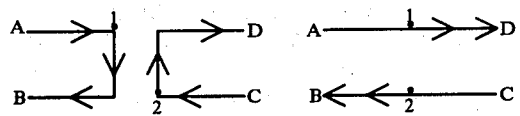

The data paths do not cross, but can be reconnected. During reconnection, the path lengths are readjusted to accommodate existing bits but not to create gaps.

The implementation of ladder structure by charge coupled devices (CCD) will now be considered. For the cross-over type of switches, a four-phase shift register element is assumed. Further, it is assumed that the common electrode for the horizontal and vertical channels is the phase-1 component for the vertical channel and phase-3 component for the horizontal channel. In this case, the two data streams will cross without interference.

The single-pole double-throw switches can be either 2-phase, 3-phase, or 4-phase, since there is no isolation needed for two crossing data streams. However, path lengths must be automatically adjusted to prevent overlapping bits and gaps when path connections are altered.

The ladder structure which has been shown can utilize more than one I/O port and the I/O port can be larger or smaller than that described herein. As an example, an I/O port can be provided at each end of the ladder to perform simultaneous data manipulation on both the head and the tail of the data sequence.

Other operations than the four basic operations shown in FIGS. 6A–6D can also be utilized. For example, the I/O port can be connected to more than just the adjacent shift register in order to provide a modified delta exchange. Also, the I/O port need not be a closed loop, and more than one I/O port can be associated with any register.

The availability of other designs for implementing the concepts described herein will be immediately apparent to designers in various technologies given the principles described with respect to the binary switch and the ladder structure.

The present structure uses intersecting data streams for provision of many functions which were not as readily realized or as efficiently realized in the prior art. In the present context, the provision of intersecting or crossing data streams has a particular meaning. That is, these words mean that the data streams have paths in the medium in which the data exists which physically cross one another. Thus, two data streams enter, cross one another, and emerge as two separate data streams in the medium. This type of crossing is to be distinguished from a crossing where two data streams meet one another and then follow the same path thereafter. Additionally, this type of crossing is distinguishable from a crossing where, for instance, a bubble domain stream is deflected from its path by another bubble domain which is planted at a circuit element, such as an idler. In the present application, the two data streams are individually maintained and physically cross one another without altering in any manner the spacing or sequence of data in the individual data streams.

In the practice of the present invention, the shift registers in which data is conventionally stored before being manipulated can be associated with the same medium as the data switch, or can be separate therefrom. For instance, data which is stored on tapes or disks can be converted to bubble domain streams in a magnetic medium or charge streams in a semiconductor medium. While in the magnetic medium or the semiconductor medium, the crossing or bypass operations can be achieved, after which the data is returned to its tape or disk storage. Thus, the advantages of the data manipulation operations described in the present application can be utilized effectively with other types of storage technology. However, the maximum advantage of the present application occurs when the storage registers and the binary mode switches are all present in a single technology environment. For instance, an all magnetic bubble domain apparatus or an all semiconductor apparatus is a convenient example.

FURTHER PRIOR ART DESCRIPTION

In the preceding portions of the present specification, various prior art data handling techniques have been mentioned. These include text editing applications, dynamically ordered storage arrangements, and storage/decoder arrangements. Additionally, a major/minor loop storage arrangement is described in U.S. Pat. No. 3,618,054. In that type of arrangement, a major loop serves as an I/O loop while information is stored in minor loops located on either side of the major loop. Information can be transferred from the major loop to the minor loops or vice versa. Information moves synchronously in the major loop as well as in the minor loops and customarily a single bit of each word is stored in each of the minor loops. Thus, all of the minor loops are accessed at the same time through the use of the major loop.

At this stage of the specification, it is more easy to particularly define the distinctions and advantages of the present invention over the prior art structures previously indicated in the specification. Firstly, the text editing arrangements described in the aforementioned copending applications Ser. No. 469,926 and 469,927 will be discussed. In those applications, there is no intersection of data streams where two data streams actually cross one another. The intersection of data streams in those applications concern only two data streams which meet one another at a common point and which will follow the same path after data manipulation. Additionally, data streams in the present application cross one another during each phase of the repetitive cycles of applied drive fields. However, in the aforementioned text editing patent applications, freeze/bypass loops are used to hold one of the data streams while the other passes. Therefore, there is no continual movement of both data streams during all phases of the applied drive field, as is the case in the present application.

It should be noted that the aforementioned text editing applications do show some structure for reversing the order of data in shift registers which can be separated from one another (idled) or which can be serially connected. However, that type of convertible structure does not utilize intersecting data streams as described herein.

The major/minor loop data arrangement referred to previously connects minor loops to have data flow therebetween but does it only through the I/O loop (major loop). There is no provision for serially connecting individual minor loops without having data flow through the major loop. Additionally, the major/minor loop schemes often require some sort of alteration of the applied drive field. For instance, the magnetic field used to move bubble domains in the magnetic medium is stopped or reversed or undergoes some type of sequence change to provide the transfers of information that result. Another distinction over the major/minor loop arrangement is that that arrangement does not have intersecting data streams of the type described in the present application where two output paths are taken after intersection. Further, when information is accessed from any of the minor loops into the major loop, there is generally a gap in the information flow through the major loop. This gap is based on geometric considerations in the minor loop/major loop structure. In contrast with this, the present apparatus does not introduce gaps into the intersecting data streams and does not in any way alter these data streams. Additionally, no gap is created when the binary switch of the present invention is switched between its bypass mode and its crossover mode. A still further distinction over the major/minor loop data arrangement is that that arangement has no apparatus which will allow only one (or any selected number) of minor loops to be connected to the major loop. Instead, all minor loops are accessed through the major loop at the same time.

The dynamically ordered storage arrangements of the prior art have been discussed previously in the specification. At this time it suffices only to say that these techniques generally rely upon the stoppage or reversal of the drive fields used to move the data. Further, there are no two-input/two-output switches of the type described in the present application. More fundamentally, data streams do not cross one another in the manner described herein.

The storage/decoder schemes, described for instance in U.S. Pat. Nos. 3,689,902 and 3,701,125, do not have intersections between data streams of the type described herein. Additionally, there are no means in those techniques for reversing the sequence of data in any data stream. Rather, data is routed to appropriate locations by the decoder, which passes particular data bits during each cycle of the drive field.

It should be noted that the basic binary switch herein is similar to the crossover switch described in U.S. Pat. No. 3,543,255, except that bypass means are also provided for preventing the crossing of data streams. Further, a control means is provided for changing the mode of operation of the switch from its crossover mode to its bypass mode, and vice versa. However, this is not the type of change which is trivial. For instance, it could easily be envisioned that a deflection circuit could be utilized to deflect data streams away from the crossover switch well before such streams got to the switch. However, this would introduce gaps in the data streams when the crossover operation was to be performed. In contrast with this, the bypass means incorporated in the crossover switch in the present application is one which does not introduce any gaps in either of the data streams, whether the switch operates in the bypass mode or in the crossover mode. Further, when the switch is changed from one mode of operation to the other no gap or alteration appears in any of the incoming or outgoing data streams.

What has been shown is a structure in which information can be held, conveyed, and manipulated. Such operations can occur in one technology and on the same chip if desired. This structure has implications in data permutation, storage management, and file editing, among others. It has the performance capabilities of many other structures already known, but with much greater flexibility. The present structure is characterized by the use of data streams which cross one another where such crossings can be directly utilized to provide all of the data handling functions previously discussed. These operations can be done without requiring any alteration, such as reversal, removal, etc., of the applied drive.

What is claimed is:

1. A data handling apparatus for moving data which can be moved in a medium in response to the application of a cycle of drive fields thereto, comprising:
   a plurality of first loops in which data streams can propagate in response to the application of drive fields,
   at least one I/O loop including write means for producing data and read means for reading data in said I/O loop,
   means for interconnecting said I/O loop to one of said first loops so that data will move from said one of said first loops to said I/O loop during application of said drive fields,
   means for separating said I/O loop and said first loop interconnected to it to prevent data from moving to said I/O loop from said interconnected first loop during application of said drive fields,
   first means for interconnecting said first loops so that data streams in the interconnected first loops will cross one another and will move one loop to an interconnected loop in response to the application of said drive fields, said first means being separate from said I/O loop and having means for interconnecting said first loops without having data flow through said I/O loop,
   second means for separating said interconnected first loops to prevent the data streams in said separated loops from moving from one separated loop to the other separated loop during application of said drive fields.

2. The apparatus of claim 1, where said first means for interconnecting includes means for connecting at least two of said first loops in series while said I/O loop is disconnected from said first loops.

3. The apparatus of claim 1, where said apparatus includes means for intersecting multiple bits of two data streams during each cycle of said drive field.

4. The apparatus of claim 1, where said data streams are comprised of magnetic bubble domains.

5. The apparatus of claim 1, where said data streams are comprised of electrical charges.

6. The apparatus of claim 1, where said first loops have a length which is a multiple of the length of said I/O loop.

7. A data handling apparatus for manipulating data which can be moved in a medium in response to application of a cycle of drive fields having a sequence of phases, comprising:
   at least two shift registers for moving said data in a first sequential order in response to a cycle of said applied drive fields,
   means for serially connecting said shift registers including means for non-destructively crossing data streams moving in said interconnected shift registers, there being two different paths for said data streams after said crossing,
   means for reversing the sequential order of data moving in said shift registers when said shift registers are serially interconnected, said means for reversing being operative without altering said cycle of applied drive fields.

8. The apparatus of claim 7, where said means for serially interconnecting is a two-input/two-output switch.

9. The apparatus of claim 7, where said means for serially interconnecting said shift registers includes means for moving said two data streams during all phases of said cycle of applied drive fields.

10. The apparatus of claim 7, including control means for activating said means for reversing at selected times.

11. The apparatus of claim 7, where said means for serially connecting includes means for crossing multiple bits of data in said crossing data streams.

12. The apparatus of claim 7, further including write means for producing data in said shaft registers.

13. The apparatus of claim 7, including means for preventing a gap in said data sequence when said shift registers are serially interconnected and when said sequential order of data is reversed.

14. The apparatus of claim 7, in which said data streams comprise magnetic bubble domains.

15. The apparatus of claim 7, in which said data streams are comprised of electrical charges.

16. A data handling apparatus for moving data in a medium, comprising:
   at least two first shift registers along which said data propagates,
   an I/O shift register having associated therewith write means for producing said data and read means for reading said data,
   first switch means located between pairs of said first shift registers for serially connecting any number of said first shift registers to provide intersecting propagation paths in said medium along which data in interconnected shift registers moves,
   said first switch means being operative without data flow through said I/O shift register,
   second switch means for interconnecting one of said first shift registers and said I/O shift register for serially connecting said one shift register and said I/O shift register to provide intersecting data paths along which data in said one shift register and said I/O shift register moves,
   third switch means for separating interconnected first shift registers to prevent the data in one of said separated shift registers from moving to the other separated shift register,
   fourth switch means for separating said one shift register and said I/O shift register to prevent the data in said one shift register and said I/O shift register from moving therebetween, control means for selectively activating said third and fourth switch means to produce said separations.

17. The apparatus of claim 16, where said control means includes means for serially interconnecting a selected number of said first shift registers by intersecting data paths.

18. The apparatus of claim 16, where said control means includes means for serially connecting any selected number of said first shift registers to said I/O shift register.

19. The apparatus of claim 16, where said first and third switch means are portions of two-input/two-output switches located between pairs of said first shift registers.

20. The apparatus of claim 16, where said second and fourth switch means are portions of a two-input/two-output switch located between said one shift register and said I/O shift register.

21. The apparatus of claim 16, where said first and second switch means provide intersecting data paths that serially connect said first shift registers and said I/O shift register.

22. The apparatus of claim 16, where said medium is a magnetic medium and said data is comprised of magnetic bubble domains.

23. The apparatus of claim 16, where said medium is a semiconductor medium and said data is comprised of electrical charges.

* * * * *